United States Patent
Nguyen-Dinh et al.

(10) Patent No.: US 10,097,112 B2
(45) Date of Patent: Oct. 9, 2018

(54) PIEZOELECTRIC ENERGY HARVESTER SYSTEM WITH COMPOSITE SHIM

(71) Applicant: VERMON S.A., Tours (FR)

(72) Inventors: An Nguyen-Dinh, La Riche (FR); Guillaume Ferin, Truyes (FR); Claire Bantignies, Tours (FR); Hung Le Khanh, Malakoff (FR); Cyril Meynier, Tours (FR); Etienne Flesch, Andresy (FR)

(73) Assignee: VERMON S.A., Tours (FR)

( * ) Notice: Subject to any disclaimer, the term of this patent is extended or adjusted under 35 U.S.C. 154(b) by 122 days.

(21) Appl. No.: 15/057,263

(22) Filed: Mar. 1, 2016

(65) Prior Publication Data
US 2017/0257040 A1    Sep. 7, 2017

(51) Int. Cl.
*H01L 41/113*    (2006.01)
*H02N 2/18*    (2006.01)
*H01L 41/047*    (2006.01)

(52) U.S. Cl.
CPC ......... *H02N 2/188* (2013.01); *H01L 41/0472* (2013.01); *H01L 41/1136* (2013.01); *H02N 2/181* (2013.01)

(58) Field of Classification Search
CPC .............. H01L 41/113; H01L 41/1132; H01L 41/1134; H01L 41/1136; H01L 41/1138; H02N 2/18
USPC ......................................................... 310/339
See application file for complete search history.

(56) References Cited

U.S. PATENT DOCUMENTS

| | | | |
|---|---|---|---|
| 4,479,385 A | 10/1984 | Koehler | |
| 5,804,083 A | 9/1998 | Ishii et al. | |
| 7,948,153 B1 | 5/2011 | Kellogg et al. | |
| 2005/0206275 A1* | 9/2005 | Radziemski | H01L 41/1136 310/339 |
| 2007/0114890 A1* | 5/2007 | Churchill | H01L 41/1136 310/339 |

(Continued)

FOREIGN PATENT DOCUMENTS

| | | |
|---|---|---|
| DE | 10 2010 041200 A1 | 3/2012 |
| DE | 10 2013 205626 A1 | 10/2014 |
| WO | 2012/107327 A1 | 8/2012 |

OTHER PUBLICATIONS

European Patent Office, International Search Report and Written Opinion issued in corresponding Application No. PCT/IB2017/000182 dated Jul. 7, 2017.

*Primary Examiner* — Derek Rosenau
(74) *Attorney, Agent, or Firm* — Stites & Harbison, PLLC; Jeffrey A. Haeberlin (57) ABSTRACT

A vibrational multi-morph piezoelectric energy harvester includes a composite shim having a parallelepiped form with a thickness dimension made smaller than width and length dimensions, and having a stiffness shifting from one extremity to the other extremity to minimize mechanical constraints developed at a clamping area; a seismic mass mounted at an end opposite to the clamping area to mechanically match the system to the surrounding vibration resonance; one or more piezoelectric layers laminated on said composite shim; and electrodes plated onto the one or more piezoelectric layers for connection to an electronic harvesting circuit, a battery, or a super capacitor.

9 Claims, 9 Drawing Sheets

(56) References Cited

U.S. PATENT DOCUMENTS

| | | | |
|---|---|---|---|
| 2007/0145861 A1* | 6/2007 | Tanner | A45F 3/08 |
| | | | 310/339 |
| 2008/0079333 A1 | 4/2008 | Ulm et al. | |
| 2010/0148519 A1 | 6/2010 | Shih et al. | |
| 2010/0194240 A1 | 8/2010 | Churchill et al. | |
| 2010/0270889 A1 | 10/2010 | Xu et al. | |
| 2011/0074249 A1 | 3/2011 | Sakashita et al. | |
| 2013/0221802 A1* | 8/2013 | Oh | H01L 41/1134 |
| | | | 310/319 |

* cited by examiner

PIEZOELECTRIC ENERGY HARVESTER SYSTEM WITH COMPOSITE SHIM

CROSS-REFERENCE TO RELATED APPLICATIONS

Not applicable.

STATEMENT REGARDING FEDERALLY SPONSORED RESEARCH OR DEVELOPMENT

Not applicable.

THE NAMES TO PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

Field of the Invention

This invention generally relates to vibrational piezoelectric energy harvesting devices where the mechanical vibrations are transformed to electrical energy to power electronic apparatus. More specifically, the present invention relates to multilayered piezoelectric vibrating mechanical devices including a composite shim acting as a flexural mechanical spring.

Description of the Related Art

Harvesting vibrational energy using resonant piezoelectric structures has long been investigated and disclosed. One architecture is a beam structure where an amorphous shim, also called "mechanical spring," is sandwiched between two piezoelectric layers, each having an electrode plated on a main surface. When such a bimorph structure is mechanically bent, flexural stresses are created in the piezoelectric layers and electrical charges proportional to the amplitude of bending are produced on the electrodes. Shunting the electrodes through an electronic circuit allows harvesting of the energy produced. Usually such piezoelectric harvesters operate at a resonance frequency of the vibrational structure in order to maximize the deformation of the piezoelectric material and therefor the electric energy output.

Common piezoelectric flexural energy harvesters operate in a 33-conversion mode (polarization is collinearly oriented compared to relevant stress) or under a 31-conversion mode (polarization direction is orthogonal to relevant stress), have parallelpiped shapes, and are of a uniform design. A common architecture of such harvesting devices can be represented by a cantilever (i.e., one-end clamped) beam structure having a loading mass mounted at the free end and free to vibration in a privileged direction. This structure is usually optimized for operations at a desired resonant frequency and to increase the flexural stress of the beam in order to maximize the energy output.

However, such architecture is subjected to performance limitation since the flexural stress over the device area does not remain constant. Indeed, typical piezoelectric harvesting cantilever beams are mechanically clamped at one end and loaded with a seismic mass at the other end for optimal operations. Therefore, the clamping area of the beam is intensively stressed during vibrations and provides the primary contribution to electrical energy production. The opposite end, where the seismic mass is generally mounted, will contribute in a much lower proportion because of the much lower locally applied stress. Thus, the inherent solution to increase the electrical power of device at constant vibration consists in maximizing the flexural stress level at the clamping area at the expense of the device reliability and durability.

A high level of flexural stress means that the harvesting device can locally (close to the clamping area) reach very high depoling voltages and critical tensile depoling stress as well. In other words, maximizing output performance will inherently degrade the product lifetime and reliability. The mandatory trade-offs between performances and lifetime for all conventional energy-harvesting designs represent the strongest limitation of current available products.

To achieve an improved uniform stress distribution, several strategies have been disclosed and experienced in the prior art. Most of them implement geometric designs to fine tune the flexural stress distribution along the length dimension, either by tapering the thickness (US20100194240A1, WO2012107327A1) or by tapering the lateral dimensions (U.S. Pat. No. 7,948,153B1). In these references, the flexural stress distribution is "geometrically" controlled either by reinforcing the structure with oriented stiffeners or by changing the thickness of the bimorph structure along the beam length or width dimension, i.e. by tapering the structure thickness. However, the above references require intricate realization processes that affect the reliability and the manufacturing costs of the subject devices.

BRIEF SUMMARY OF THE INVENTION

In the present invention, a new composite shim is disclosed. This shim functions as a mechanical spring having an optimally adjusted flexural stress while keeping constant and symmetrical geometries that facilitate manufacturing and assembly processes. This innovative shim does not affect the shape and geometry of the multi-morph harvesting device, so it remains compatible with standard cost-efficient fabrication techniques and capable of integration within autonomous miniaturized apparatuses, such as medical implants or embedded sensor modules for Structure Health Monitoring (SHM) systems.

The embodiments described herein include a new shim (referred to herein as a "Programmed Stress Composite Shim Structure" or "PS-CSS") and constituents for Piezoelectric Energy Harvesting (PEH) devices to improve control of the stiffness distributions along the lateral (orthogonal to the main displacement direction) dimensions of the vibrating device. The PS-CSS is compatible with all types of piezoelectric material and deposition methods, (i.e. bulk, printed, deposited, and epitaxially grown). The PS-CSS is generally shaped as a mechanical longitudinal parallelepiped beam having a thickness that is smaller (preferably much smaller) than the other dimensions (length and width) with either one extremity rigidly clamped and the other extremity loaded with a seismic mass, or clamped on both extremities and loaded by a seismic mass at a position located between the two extremities. In some particular configurations, the PS-CSS is a circular disc having its periphery rigidly clamped and a seismic mass mounted at its center.

The PS-CSS is preferably made of a non-homogeneous composition where different materials are mixed or embedded. The piezoelectric material is preferably deposited on the main faces of the PS-CSS to respond to stress exerted according to the bending curvature of the PS-CSS produced by vertical accelerations generated either by a seismic mass or its own mass under vibrations.

In some embodiments, the PS-CSS includes a non-homogeneous composition wherein sub-structures shaped in pillars of a first material are embedded in a non-regular distribution configuration within a matrix structure of a second material. The pillars have section geometries varying from circular to ovoid or rectangular or triangular or any other section forms that can be produce by available industrial processes.

In some other embodiments, the PS-CSS includes wall sub-structures made up of a first material, which are embedded in crossing oriented configuration within a matrix structure made up of a second material.

In some embodiments, the PS-CSS includes embedded pillars with circular, rectangular, triangular, or any other section shapes, wherein the pillars have a transverse cross-sectional area that varies progressively from a center of the pillar to the respective ends (i.e., the external faces coinciding with the main surfaces of the PS-CSS).

DETAILED DESCRIPTION OF EXEMPLARY EMBODIMENTS OF THE INVENTION

An objective of the invention is to provide a more uniform and optimum stress distribution over the beam length to maximize the harvested quantity of energy when keeping the device operations safe from critical tensile stress areas.

The vibrational electromechanical structure presented in the exemplary embodiments described herein can advantageously be used to harvest energy from vibrations within extended frequency ranges (from 1 Hz to 1 KHz) for applications in medical, industrial, automotive, and construction. The structure includes a multilayered bimorph or mono-morph vibrating mechanical construction having one or several inner or outer composite materials acting as a flexural mechanical spring. The structure can be either a beam or a membrane with multiple and mixed boundary conditions (clamped or free) and internal element cross-sectional shapes (including but not limited to circular, rectangular, trapezoidal, ovoid, and squared).

The operating harvesting modes can utilize electromechanical transformation under a 33-conversion mode (polarization is collinearly oriented compared to relevant stress) or under a 31-conversion mode (polarization direction is orthogonal to relevant stress). Each active layer can be independently stacked according to its polarization direction and electrical connection (in serial or in parallel).

Figure 1:
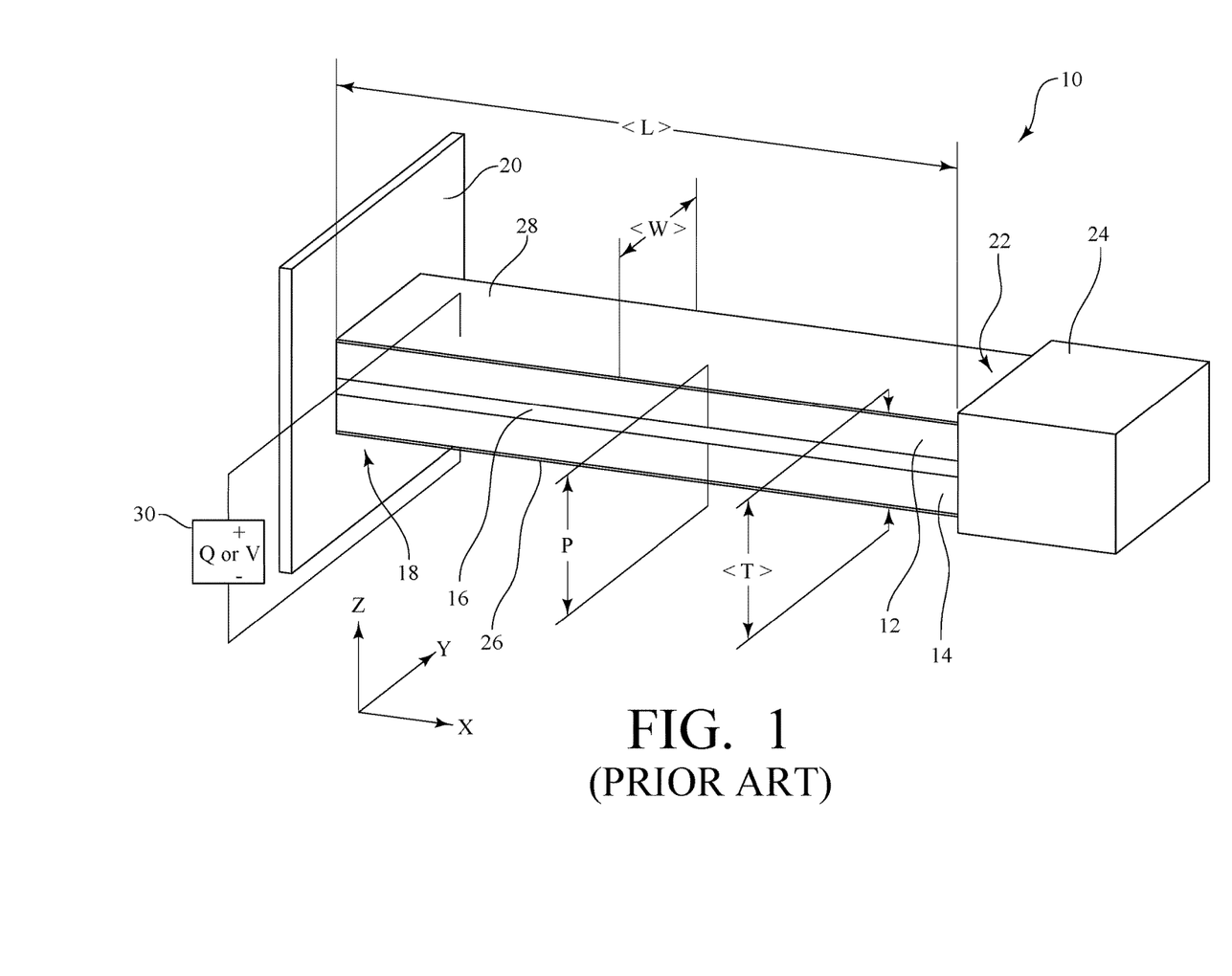
FIG. 1 is a schematic diagram of a conventional Piezoelectric Energy Harvesting (PEH) beam having a cantilever architecture.
Figure 2:
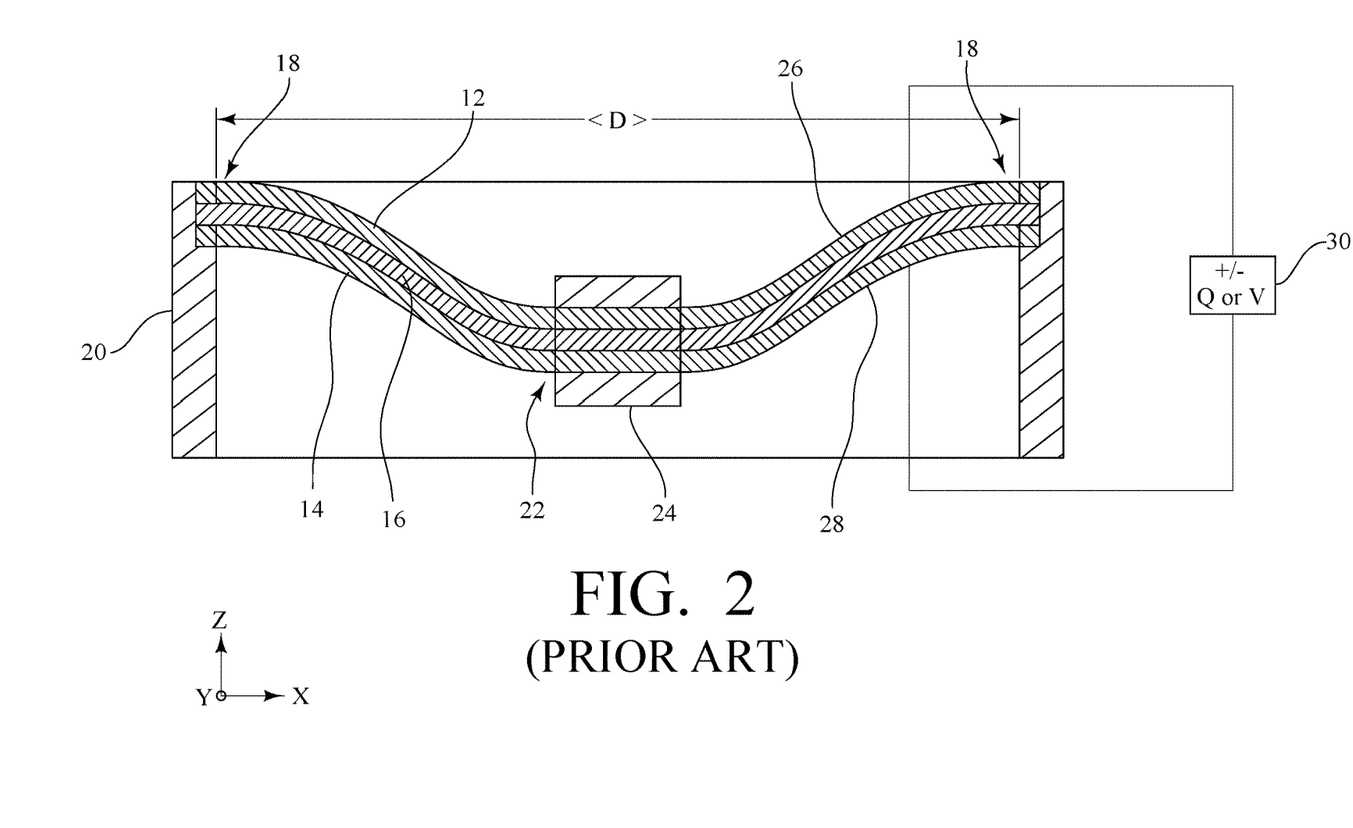
FIG. 2 is a schematic sectional diagram of a conventional PEH beam clamped at both ends.

FIG. 1 and FIG. 2 show two main types of multi-morph Piezoelectric Energy Harvesting (PEH) devices as usually found in the prior-art. FIG. 1 is a schematic diagram of a conventional PEH beam 10 that includes two piezoelectric layers 12, 14 (such as of lead zirconate titanate (PZT)) of equal thickness assembled on opposite main surfaces of a shim 16. The PEH beam 10 is then clamped at a first end 18 (i.e., a first major extremity) into structure 20 (i.e., a structure in which the PEH beam is mounted), forming a cantilever beam, and a second end 22 (i.e., a second, opposite major extremity) is mounted with a seismic mass 24 that makes the cantilever vibrate at predetermined frequency. Directions X, Y and Z, respectively, correspond to references: along the beam length L, along the beam width W, and along the beam thickness T. The piezoelectric layers 12, 14 are assembled in the same or opposite polarity orientation and are plated with electrodes 26, 28 on their external main surfaces. The electrodes 26, 28 are electrically connected to a harvesting electronic circuit 30. A rectifier (not shown) will enable the circuit 30 to collect the electrical energy produced, and to store the collected energy into a storage unit (super capacitive storage, or battery storage).

In FIG. 2, the directions X, Y and Z remain unchanged and the PEH beam 10 is clamped at both the first end 18 and the second end 22 (opposite extremities). The seismic mass 24 is mounted at an equal distance between the first end 18 and the second end 22.

When subject to vibrations, the seismic mass 24 moves up and down in the direction of the Z axis and makes the PEH beam 10 bend (deflect) with an amplitude according to applied acceleration forces. The deflection of the PEH beam stresses the piezoelectric layers 12, 14 in opposite ways (traction/compression). Consequently, positive and negative electrical charges will respectively occur on the electrodes 26, 28 during bending cycles and will be harvested by the harvesting electronic circuit 30 connected thereto. A rectifier (not shown) will enable the circuit 30 to collect the electrical energy produced, whatever its polarity, and to store the collected energy into a storage unit (capacitor or battery)(not shown).

Figure 3:
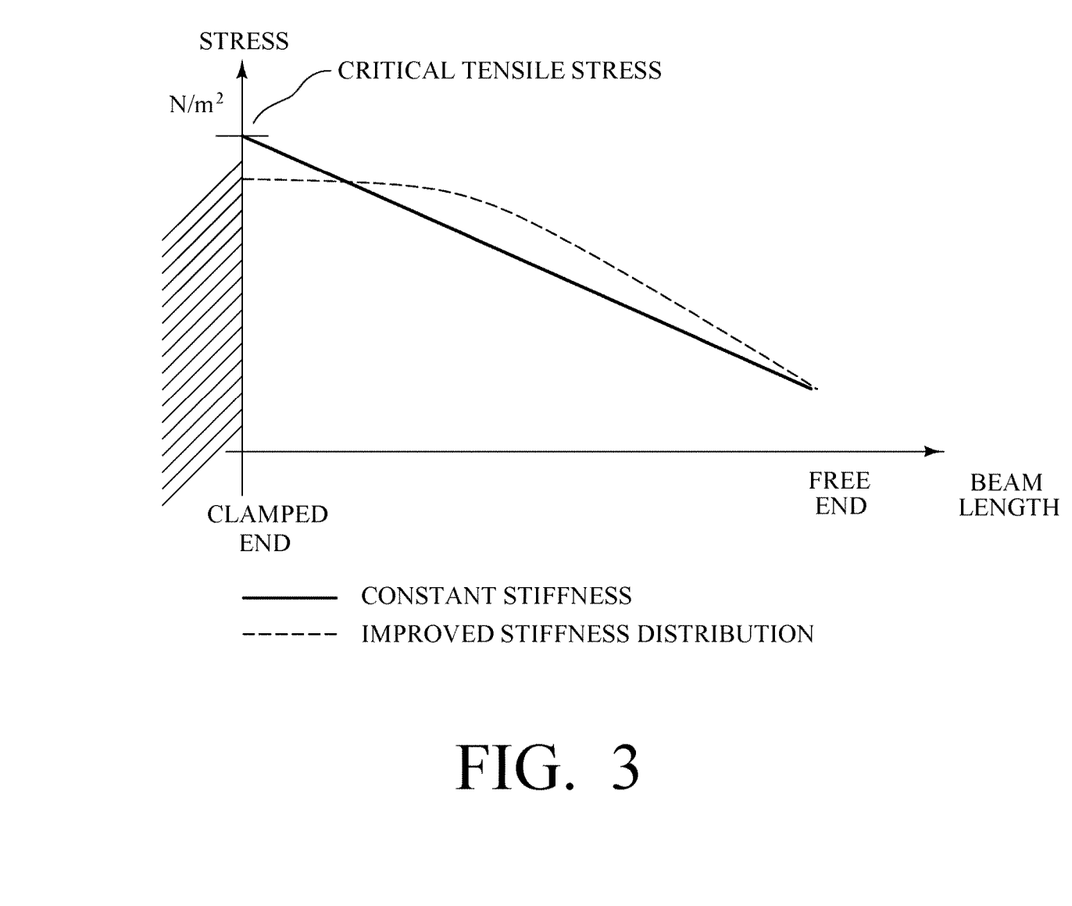
FIG. 3 is a graph of stress along a beam for a one clamped extremity PEH beam with a conventional structure as compared to Programmed Stress Composite Shim Structure (PS-CS S) beam.

FIG. 3 depicts the curve of stress along a beam for a one clamped extremity PEH beam with a conventional structure as compared to a Programmed Stress Composite Shim Structure (PS-CSS) beam (i.e., a beam according to the invention) where improvement of the maximum stress is observed on the whole beam length while the tensile stress at the clamping area is reduced significantly. This graph demonstrates the benefit of the PS-CSS beam within multi-morph PEH designs. It is noticed that the tensile stress improvement varies with composite shim structure (CSS) design optimizations which are disclosed in further details in the other illustrations and descriptions.

FIG. 4 TO FIG. 17 show embodiments of the invention hereafter disclosed. All of the embodiments have the following common features: constant thickness (Z-axis); simple geometries (rectangular or circular shapes); and a composite shim structure (i.e., a PS-CSS). Geometry and thickness constraints are governed by a simplified manufacturing process and compactness of the device.

Figure 4:
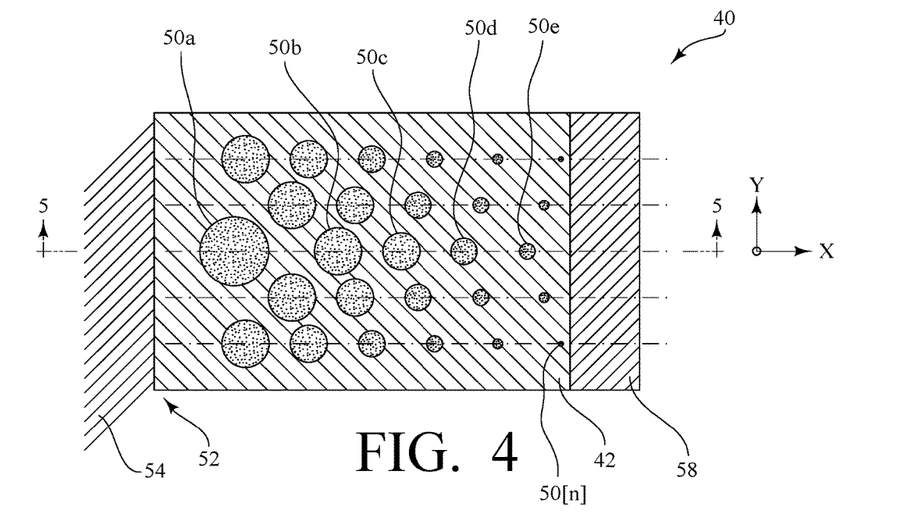
FIG. 4 is a schematic sectional view in a X-Y plane, with reference to the section line shown in FIG. 5, of an exemplary PEH beam according to an embodiment of the invention.
Figure 5:
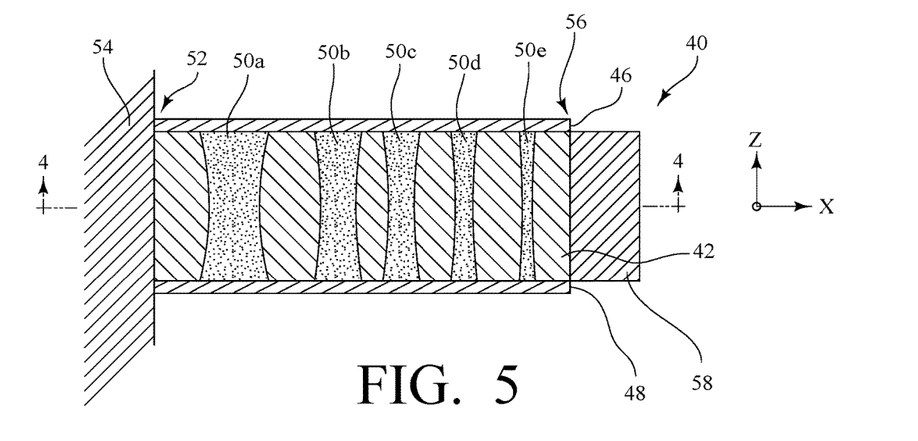
FIG. 5 is a schematic sectional view in a X-Z plane, with reference to the section line shown in FIG. 4, of the exemplary PEH beam of FIG. 4.

In FIG. 4 and FIG. 5, a PEH beam 40 is presented in respective sectional views in a X-Y plane and a X-Z plane. PEH beam 40 includes a composite shim 42 made of a first material that can be part of the group of metals, organics, or inorganics and having desired Young's modulus values preferably in the range from dozens GPa to hundred GPa to withstand the applied curvature without damage, a first piezoelectric layer 46 deposited on the upper surface of the composite shim 42, a second piezoelectric layer 48 deposited on the bottom surface of the composite shim 42, and plurality of independent sub-structured pillars $50a$-$50[n]$, where [n] is a reference corresponding to the total number of pillars (collectively referred to as pillars 50), oriented in the Z-axis direction and being distributed to map the composite shim 42 from one extremity to the other extremity. The pillars 50 are preferably filled with an organic, inorganic or metal material. The material of the pillars 50 can be any kind of material provided that it is different from the first material in order to realize a composite structure. However, it is desirable to select a material having a Young's modulus that is different from the Young's modulus of the first material 44 in order to provide a tapered stiffness along the beam 40. The material of the pillars 50 can be isotropic or anisotropic, and can have a Young's modulus along the flexural axis between 10 MPa to 500 GPa and a Poisson's ratio ranging from 0.2 to 0.4. The materials of the pillars 50 can be a polymer, a metal, or a polycrystalline or monocrystalline ceramic possibly mixed with electrical and mechanical agents such as air bubbles, nano or macro particles of oxides, ceramics, or metals. A dense material, like tungsten, can also be incorporated into the first material 44 to act as a local mass without any external assembly process. In another embodiment of FIG. 4 and FIG. 5, pillars 50 can be voids filled with air or inert gas and may be closed by their extremities or opened. As voids filled with air or inert gas, pillars 50 have a Young's modulus very different than that of the composite shim 42 or the piezoelectric layers 46 and 48, which will provide the PEH beam 40 with a tapered stiffness along the deformation axis (X-axis).

Furthermore, the pillars 50 can be cylindrical or in a double-horn profile having cross-sectional diameter that varies from the center to the outermost surfaces of each of the pillars 50. The PEH beam 40 has a first end 52 (a first extremity) clamped into a hosting body 54, which is considered as fixed, and a second end 56 (an opposite extremity) mounted with a seismic mass 58 usually made up of high density material such as tungsten or the like to minimize the volume. As shown in FIG. 4, the pillars 50 are arranged differently when observed in X or in Y directions. Indeed, along the X-axis direction, the pillars 50 are positioned from the clamping extremity (left) to seismic extremity (right) with diameters shifting progressively from maximum to minimum, while in the Y-axis direction, the diameters of the pillars 50 decreases regularly from the center to the edges of beam; the same rule is applied to every line of pillars arranged parallel to the X-axis. This arrangement is applicable for cylindrical pillars or horn-shaped pillars with no change.

Figure 6:
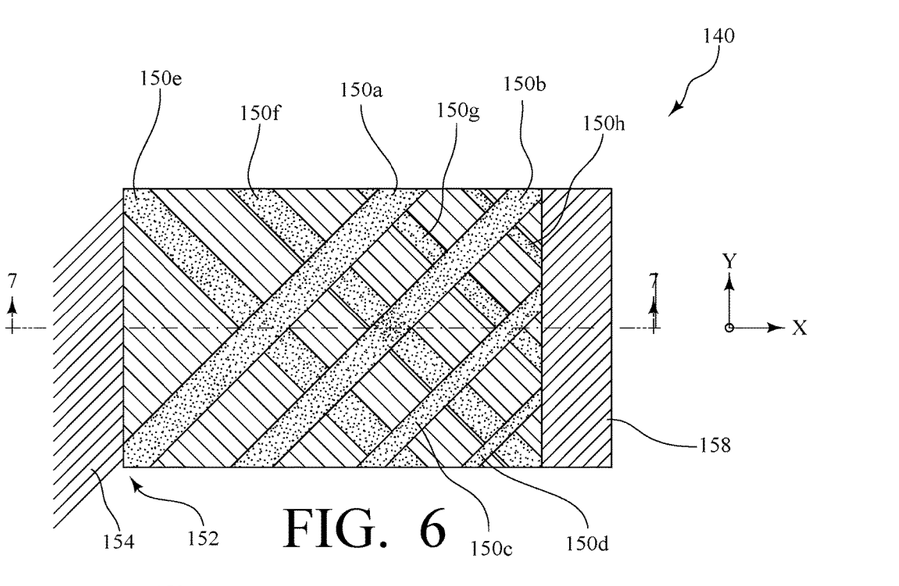
FIG. 6 is a schematic sectional view in a X-Y plane, with reference to the section line shown in FIG. 7, of an exemplary PEH beam according to another embodiment of the invention.
Figure 7:
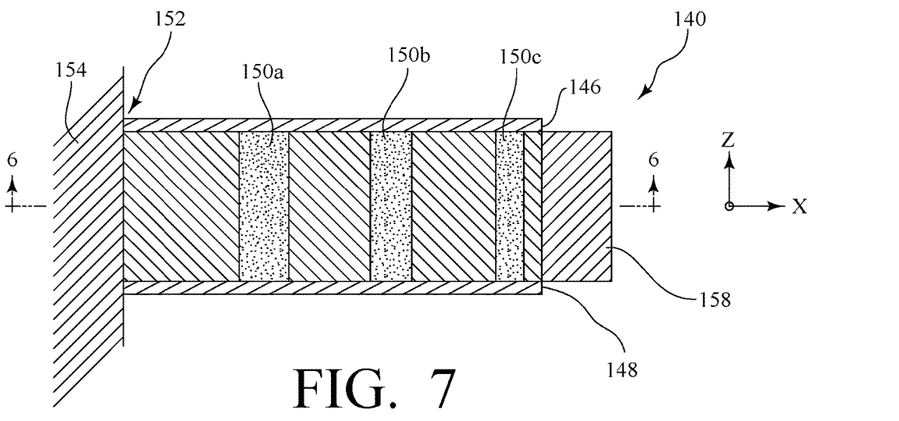
FIG. 7 is a schematic sectional view in a X-Z plane, with reference to the section line shown in FIG. 6, of the exemplary PEH beam of FIG. 6.

In FIG. 6 and FIG. 7, a PEH beam 140 is clamped at a first end 152 within a hosting body 154, the seismic mass 158 is mounted at a second end 156 of the PEH beam 140. A composite shim 142 comprises a first material of the group of materials previously described with respect to FIG. 4 and FIG. 5, and sub-structured walls $150a$-$150h$ (collectively referred to as sub-structured walls 150) positioned vertically along the Z-axis direction and split into two separate groups being crossed perpendicularly and making with the X-axis angles of +/−45 degrees. The sub-structured walls 150 are arranged from left to right with progressive wall thickness decreasing in the same manner. The sub-structured walls 150 can be of any kind of material provided that it is different than the first material in order to realize a composite structure. However it is desirable that material of the sub-structured walls 150 have a Young's modulus different than that of the first material in order to provide a tapered stiffness features along the PEH beam 140. In one implementation, the material of the sub-structured walls 150 is a flexible polymer in combination with a metal or a rigid constituent, such that a stiffness of the PEH beam 140 will vary progressively from left to right. The flexible polymer can be of a group of epoxies, polyurethanes or silicon rubbers or the like, and can be filled within the sub-structure walls 150 by capillarity forces or vacuum filled prior to a curing process. A first piezoelectric layer 146 is deposited on the upper surface of the composite shim 142, and a second piezoelectric layer 148 is deposited on the bottom surface of the composite shim 42. Metal electrodes (not shown) are plated on the faces of the first piezoelectric layer 146 and the second piezoelectric layer 148 to provide electrical connections to the PEH beam 140.

Figure 8:
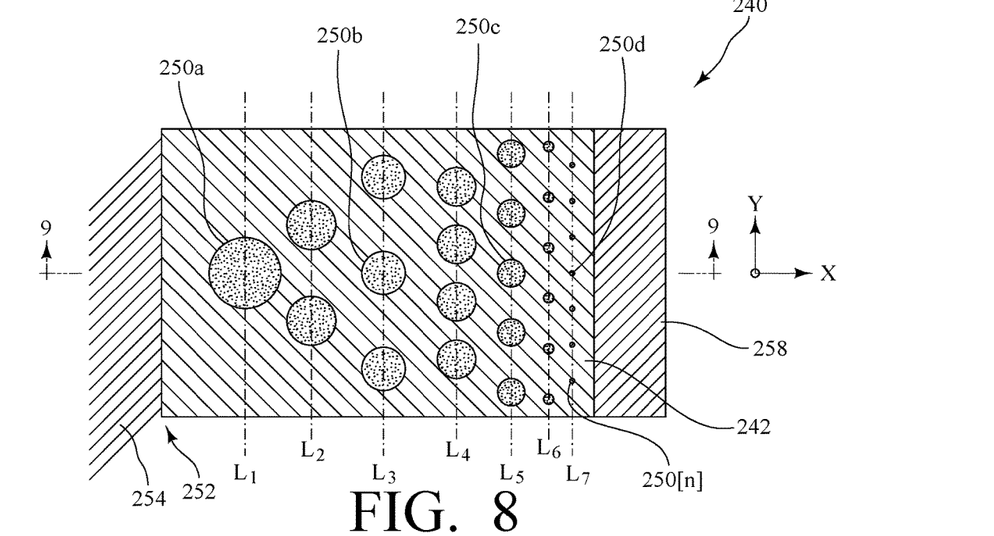
FIG. 8 is a schematic sectional view in a X-Y plane, with reference to the section line shown in FIG. 9, of an exemplary PEH beam according to another embodiment of the invention.
Figure 9:
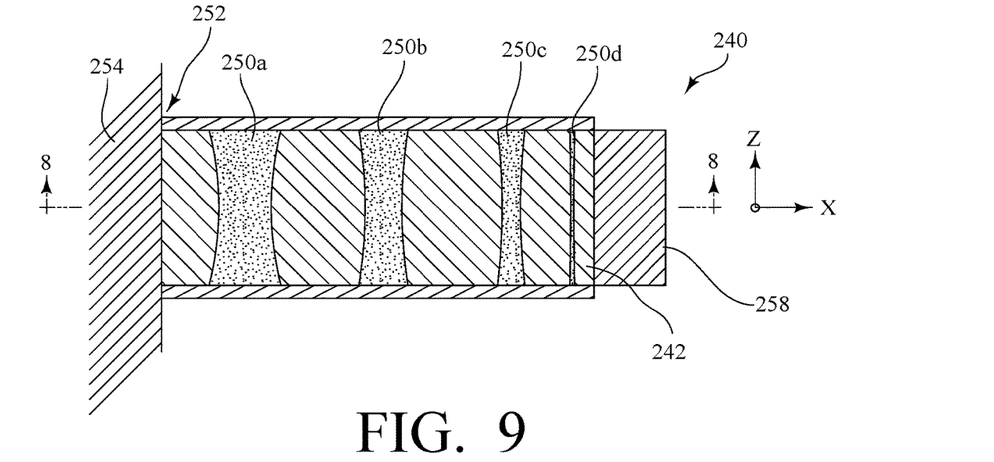
FIG. 9 is a schematic sectional view in a X-Z plane, with reference to the section line shown in FIG. 8, of the exemplary PEH beam of FIG. 8.

In FIG. 8 and FIG. 9, a PEH beam 240 with a composite shim 242 is disclosed similar the PEH beam 40 of FIG. 4 and FIG. 5, but sub-structures pillars $250a$-$250[n]$, where [n] is a reference corresponding to the total number of pillars (collectively referred to as pillars 250), are arranged from left to right with pillar diameter progressively decreasing. A left end 252 (i.e., a left extremity) of the PEH beam 240 is clamped to a hosting body 254 and a right end 256 (i.e., a right extremity) is mounted with seismic mass 258. Arrangement of the pillars 250 is along the X-axis to provide tapered stiffness to the composite shim 242. The pillars 250 are arranged along lines $L_n$, where n=1 to a number of lines, from left to right and parallel to Y-axis, pillars of line $L_{n-1}$ are bigger in diameter than those of line $L_n$, and so on. Lines $L_{n-1}$ can be advantageously arranged to increase the density of the pillars 250 on the surface of the composite shim 242. Materials for the pillars 250 and the composite shim 242 have sufficiently different Young's modulus (order of 1:10 or more is desirable) to achieve desired tapered stiffness to the PEH beam 240.

Figure 10:
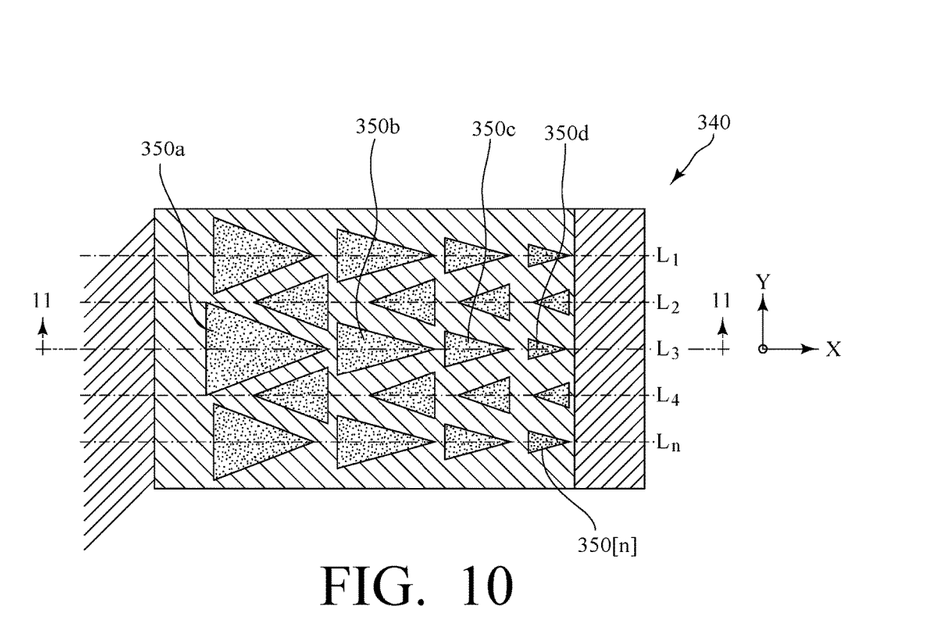
FIG. 10 is a schematic sectional view in a X-Y plane, with reference to the section line shown in FIG. 11, of an exemplary PEH beam according to another embodiment of the invention.
Figure 11:
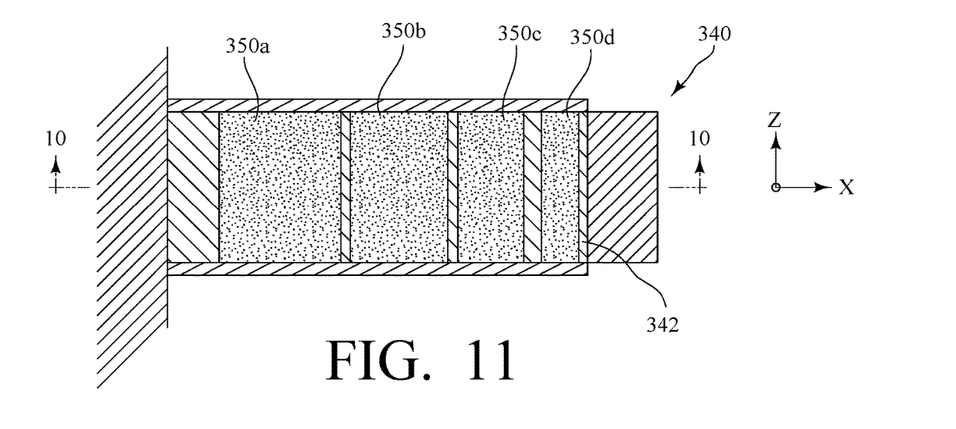
FIG. 11 is a schematic sectional view in a X-Z plane, with reference to the section line shown in FIG. 10, of the exemplary PEH beam of FIG. 10.

In FIG. 10 and FIG. 11, a PEH beam 340 with a composite shim 342 is disclosed similar the PEH beam 40 of FIG. 4 and FIG. 5, but sub-structures pillars 350a-350[n], where [n] is a reference corresponding to the total number of pillars (collectively referred to as pillars 350), are made rectangular in cross-section in the X-Z plane (FIG. 11) and triangular in cross-section in the X-Y plane (FIG. 10), and are arranged by lines equidistant $L_{1-n}$ parallel to X-axis from top to bottom, the pillars 350 belonging to consecutive lines $L_j$ and $L_k$ can be oriented in head to tail fashion. This configuration allows higher density of pillars over the surface of the composite shim 342. The material of the composite shim 342 (i.e., a first material) and the material of the pillars 350 have the same characteristics as disclosed with respect to the composite shim 42 described with respect to the embodiment of FIG. 4 and FIG. 5.

The embodiments described above with respect to FIG. 4 through FIG. 11 relate to PEH beam systems having one end clamped to a hosting body and the opposite end mounted with a seismic mass, according to a vibration frequency or amplitude. The description of the exemplary composite shim configurations is provided for understanding and the drawings are not to scale. The embodiments are exemplary and not intended limit the invention. The pillar cross-sections are here above shown in circular, rectangular (wall) or triangular for the sake of simplicity of understanding, the present invention can be applied with no change on its principle to any other constant or non-constant pillar cross-section.

Figure 12:
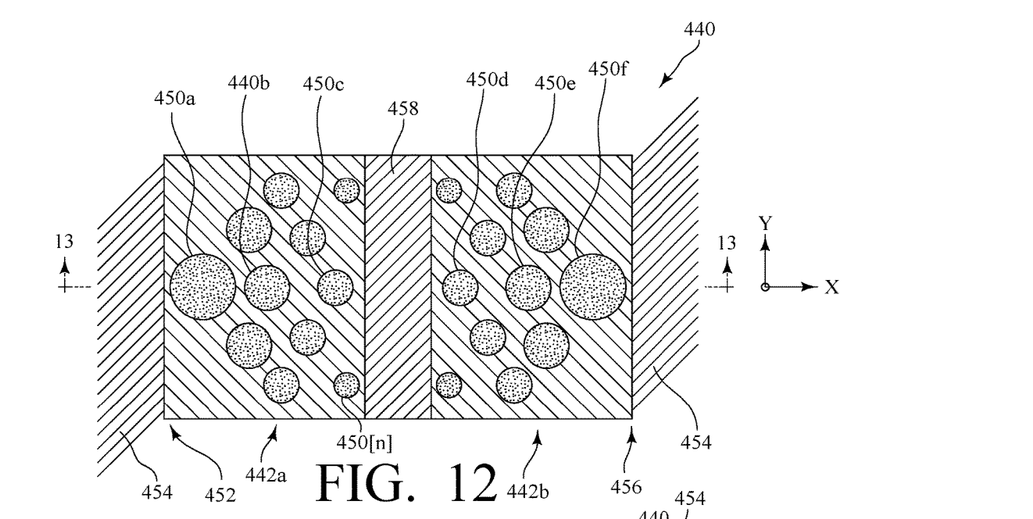
FIG. 12 is a schematic sectional view in a X-Y plane, with reference to the section line shown in FIG. 13, of an exemplary PEH beam according to another embodiment of the invention.
Figure 13:
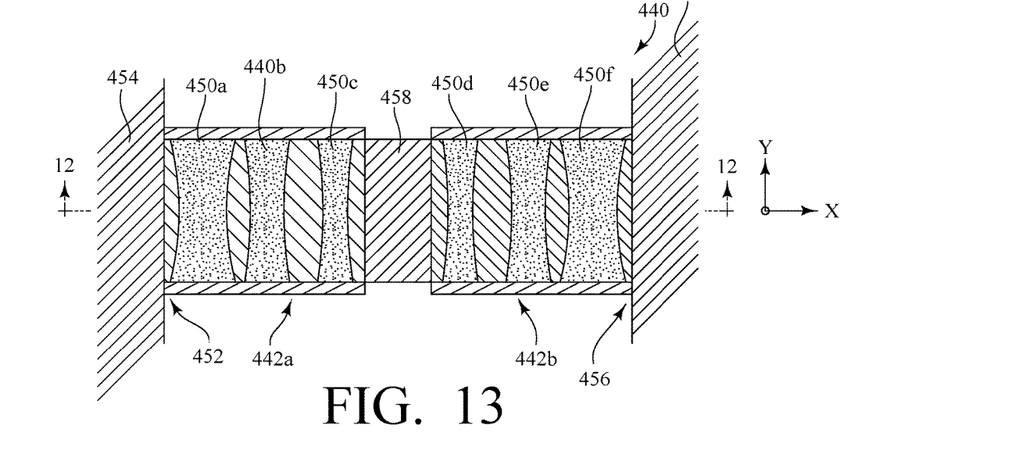
FIG. 13 is a schematic sectional view in a X-Z plane, with reference to the section line shown in FIG. 12, of the exemplary PEH beam of FIG. 12.

FIG. 12 and FIG. 13 show another embodiment of the invention, where a PEH beam 440 is symmetrically clamped with respect to the position of a seismic mass 458, as shown. The PEH beam 440 is based on the embodiments described with respect to FIG. 4 through FIG. 11, but with the seismic mass 458 mounted at a center of the PEH beam 440 in equal distance of the two ends 452, 456 (i.e., extremities), which are clamped into a hosting body 454. Thus, the PEH beam 440 is split in two separate sections separated by the seismic mass 458 and forming a symmetric system. As shown, the left half and the right half of the PEH beam 440 constitute respectively a left composite shim 442a and a right composite shim 442b that are preferably equivalent symmetrically in term of structure arrangement and stiffness distribution. The left composite shim 442a and the right composite shim 442b have composite structures applied symmetrically, as described with respect to the embodiments of FIG. 4 through FIG. 11, with the same kind of pillars, materials and arrangements. FIG. 12 and FIG. 13 show the left composite shim 442a and the right composite shim 442b with an arrangement of pillars 450 similar to the arrangement of pillars 50 with respect to the embodiment of FIG. 4 and FIG. 5, and, therefore, all descriptions of pillar cross-sections, filling materials and arrangements with respect to the embodiment of FIG. 4 and FIG. 5 can be applied without limitation to embodiment of FIG. 12 and FIG. 13.

Figure 14:
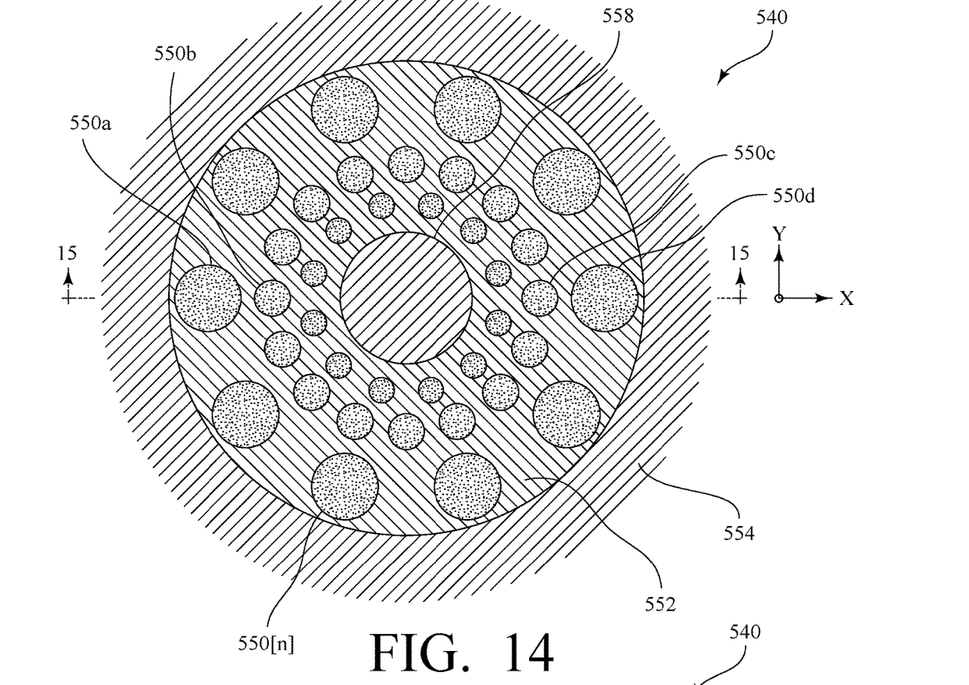
FIG. 14 is a schematic sectional view in a X-Y plane, with reference to the section line shown in FIG. 15, of an exemplary PEH beam according to another embodiment of the invention.
Figure 15:
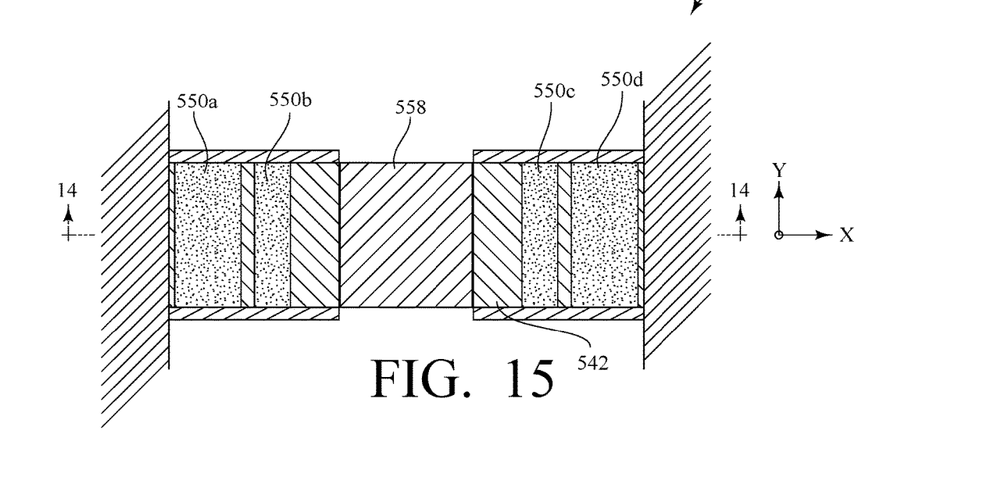
FIG. 15 is a schematic sectional view in a X-Z plane, with reference to the section line shown in FIG. 14, of the exemplary PEH beam of FIG. 14.

In FIG. 14 and FIG. 15, a disc shaped PEH beam 540 is entirely clamped at its periphery into a hosting body 554. A center of the PEH beam 540 is occupied by a circular seismic mass 558, which is designed to be at equal distance of the periphery of the PEH beam 540. A composite shim 542 occupies the annuli between the periphery and the external diameter of seismic mass 558. Pillars 550a-550[n], where [n] is a reference corresponding to the total number of pillars (collectively referred to as pillars 550), are arranged in concentric circles from the periphery to the center, regularly distributed and aligned with the Z-axis. The diameter of the pillars 550 decreases from the peripheral circle to the central circle. However, the diameter of the pillars 550 could increase from the peripheral circle to the central circle, depending on the desired stiffness function of the composite shim 542. FIG. 14 and FIG. 15 show the pillars 550 with a circular cross-section as an example and for the sake of simplicity, however, one of skill in the art will understand that the pillar cross-section can be of any shape and the pillar profile can be straight or curved with no change in the scope of the invention disclosed herein. The configurations and materials of the composite shim 542 (i.e., a first material and a material of the pillars 550) may have the same characteristics as those disclosed with respect to the composite shims 42, 142, 242, 342 described with respect to the embodiments of FIG. 4 through FIG. 11. Furthermore, the circular shape of the PEH beam 540 is provided as an example of realization, but the PEH beam 540 may also be other ovoid shapes or polygonal shapes.

Composite materials as disclosed hereinabove for the exemplary composite shims provide an opportunity to take advantage of a combination of different materials and to add material distributions as a new degree of freedom to ideally shape the resulting composite parts to a dedicated mechanical function, here a tunable flexural spring evolving in both X and Y axis for a given thickness. The composite shims comprise a first material that is mechanically or chemically processed to create through holes that can be filled or not (air or vacuum filled) with one or several other materials to form the pillars. The pillars are configured with a number of composite patterns.

FIG. 4 to FIG. 15 show patterns of composite shims assembled with two or more materials. The basic objectives are to decrease the flexural stiffness gradually from the clamped end to the free end by keeping a uniform shape. That can be done by inserting softer materials into a rigid frame through filled inclusions of different shapes (rectangular, triangles, circles, trenches or complex shapes) and sizes (from nano porosity to macro holes). These complex inclusions are done through different processing approaches such as LASER/mechanical dicing or drilling, porosity creation by dry or wet etching, photo erosion, ion beam etching, electro erosion, or using additive techniques such as 3D printing, epitaxy.

According to the material to be inserted different filling techniques are used such as compression molding, infusion, tape casting, screen printing, electroless, DC or RF magnetron sputtering, CVD, PVD (PECVD and LPCVD) deposition technics combined with back grinding or CMP (Chemical Mechanical Polishing). These methods of manufacturing the composite shim of the present invention are provided for the sake of applicable examples they do not intend to limit the present invention.

What is claimed is:
1. A piezoelectric energy harvester system comprising:
a composite shim having a parallelepiped form with a thickness dimension made smaller than a width dimension and a length dimension, and having a stiffness shifting from one extremity to another extremity to minimize mechanical constraints developed at a clamping area;

a seismic mass mounted at an end opposite to the clamping area to mechanically match the system to surrounding vibration resonance;

one or more piezoelectric layers laminated on the composite shim;

electrodes plated onto the one or more piezoelectric layers for connection to an electronic harvesting circuit, a battery, or a super capacitor; and pillars embedded in the composite shim, each of the pillars having a diameter that varies in size based on its location in the composite shim.

2. The piezoelectric energy harvester system of claim 1, wherein the pillars are arranged in lines parallel to an axis in the width dimension of the composite shim.

3. The piezoelectric energy harvester system of claim 1, wherein the composite shim comprises a first material and the pillars comprise a material that is different than the first material.

4. A piezoelectric energy harvester comprising:

a composite shim having a parallelepiped form with a thickness dimension made smaller than a width dimension and a length dimension, and having a stiffness shifting from one extremity to another extremity to minimize mechanical constraints developed at a clamping area;

a seismic mass mounted at an end opposite to the clamping area to mechanically match the system to surrounding vibration resonance;

one or more piezoelectric layers laminated on the composite shim;

electrodes plated onto the one or more piezoelectric layers for connection to an electronic harvesting circuit, a battery, or a super capacitor; and pillars embedded in the composite shim, each of the pillars having a triangular cross-section that varies in size depending on its location in the composite shim.

5. The piezoelectric energy harvester system of claim 4, wherein the composite shim comprises a first material and the pillars comprise a material that is different than the first material.

6. A piezoelectric energy harvester system comprising:

a composite shim having a parallelepiped form with a thickness dimension made smaller than a width dimension and a length dimension, and having a stiffness shifting from one extremity to another extremity to minimize mechanical constraints developed at a clamping area;

a seismic mass mounted at an end opposite to the clamping area to mechanically match the system to surrounding vibration resonance;

one or more piezoelectric layers laminated on the composite shim;

electrodes plated onto the one or more piezoelectric layers for connection to an electronic harvesting circuit, a battery, or a super capacitor; and walls embedded in the composite shim, each of the walls arranged parallel to an axis in the thickness dimension and forming an angle with an axis in the width dimension and an axis in the length dimension, each of the walls having a width that varies in size based on its location in the composite shim.

7. The piezoelectric energy harvester system of claim 6, wherein the composite shim comprises a first material and the walls comprise a material that is different than the first material.

8. A piezoelectric energy harvester system comprising:

a composite shim having a circular or ovoid form with a thickness dimension made smaller than major and minor dimensions, and having a stiffness shifting from one extremity to another extremity to minimize mechanical constraints developed at a clamping area;

a seismic mass mounted at a center of gravity of the composite shim to mechanically match the system to surrounding vibration resonance;

one or more piezoelectric layers laminated on the composite shim;

electrodes plated onto the one or more piezoelectric layers for connection to an electronic harvesting circuit, a battery, or a super capacitor; and pillars embedded in the composite shim, each of the pillars having a shape that varies in size based on its location in the composite shim.

9. A piezoelectric energy harvester system comprising:

a composite shim having a parallelepiped form with a thickness dimension made several orders of magnitude smaller than width and length dimensions, including two ends and clamping areas at each of the two ends, and having a stiffness shifting from each of the clamping areas to a maximum amplitude displacement area to minimize mechanical constraints developed at the clamping areas;

a seismic mass mounted at a center of the composite shim to mechanically match the system to surrounding vibration resonance;

one or more piezoelectric layers laminated on the composite shim;

electrodes plated onto the one or more piezoelectric layers for connection to an electronic harvesting circuit, a battery, or a super capacitor; and pillars embedded in the composite shim, each of the pillars having a shape that varies in size based on its location in the composite shim.

* * * * *